(12) United States Patent
Pagaila et al.

(10) Patent No.: US 7,772,046 B2
(45) Date of Patent: Aug. 10, 2010

(54) SEMICONDUCTOR DEVICE HAVING ELECTRICAL DEVICES MOUNTED TO IPD STRUCTURE AND METHOD FOR SHIELDING ELECTROMAGNETIC INTERFERENCE

(75) Inventors: Reza A. Pagaila, Singapore (SG); Byung Tai Do, Singapore (SG); Yaojian Lin, Singapore (SG); Rui Huang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 23 days.

(21) Appl. No.: 12/133,133

(22) Filed: Jun. 4, 2008

(65) Prior Publication Data
US 2009/0302439 A1  Dec. 10, 2009

(51) Int. Cl.
*H01L 21/58* (2006.01)
(52) U.S. Cl. ............................... 438/127; 257/E21.502
(58) Field of Classification Search .................. 257/699
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 6,838,748 B2 | 1/2005 | Ishio et al. | |
| 7,125,744 B2 | 10/2006 | Takehara et al. | |
| 7,187,060 B2 | 3/2007 | Usui | |
| 7,619,901 B2 | 11/2009 | Eichelberger et al. | |
| 2004/0084766 A1* | 5/2004 | Shieh et al. ................. | 257/724 |

* cited by examiner

*Primary Examiner*—Stephen W Smoot
(74) *Attorney, Agent, or Firm*—Robert D. Atkins

(57) ABSTRACT

A semiconductor device is made by forming an integrated passive device (IPD) structure on a substrate, mounting first and second electrical devices to a first surface of the IPD structure, depositing encapsulant over the first and second electrical devices and IPD structure, forming a shielding layer over the encapsulant, and electrically connecting the shielding layer to a conductive channel in the IPD structure. The conductive channel is connected to ground potential to isolate the first and second electrical devices from external interference. A recess can be formed in the encapsulant material between the first and second electrical devices. The shielding layer extends into the recess. An interconnect structure is formed on a second surface of the IPD structure. The interconnect structure is electrically connected to the first and second electrical devices and IPD structure. A shielding cage can be formed over the first electrical device prior to depositing encapsulant.

19 Claims, 6 Drawing Sheets

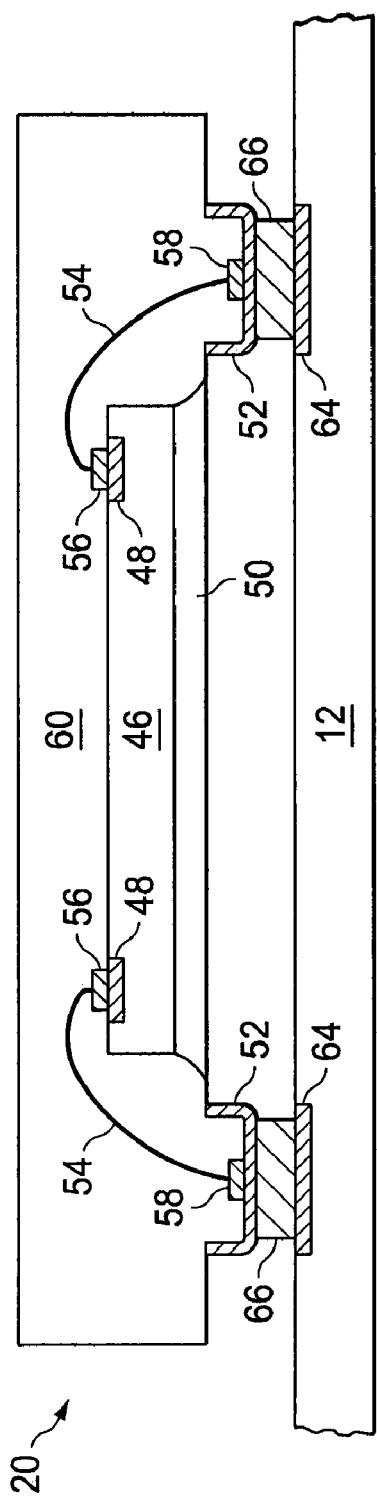
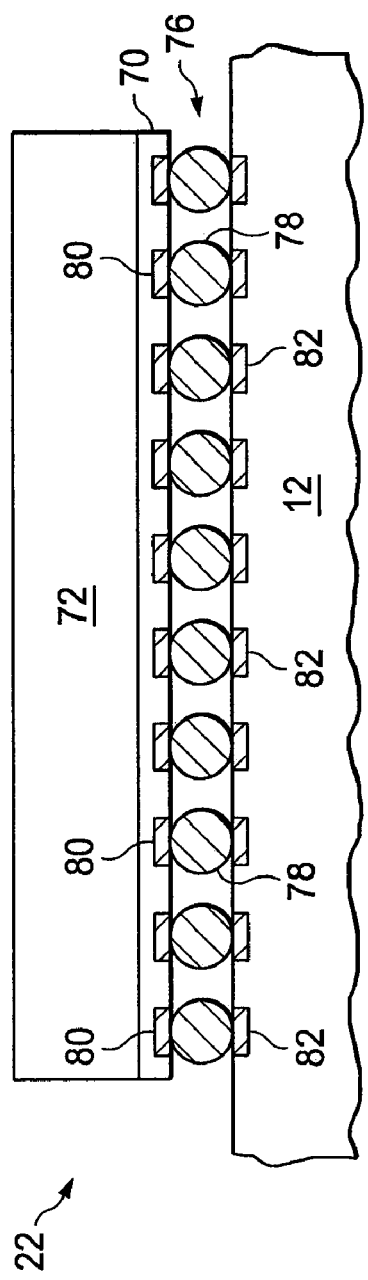
FIG. 2c
FIG. 2d

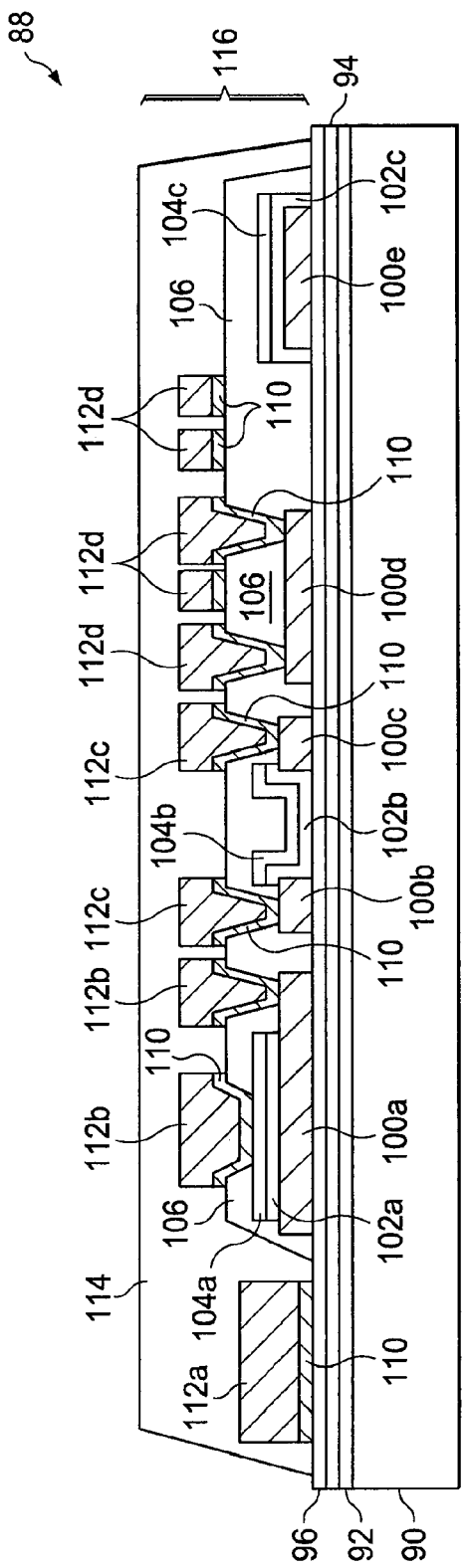
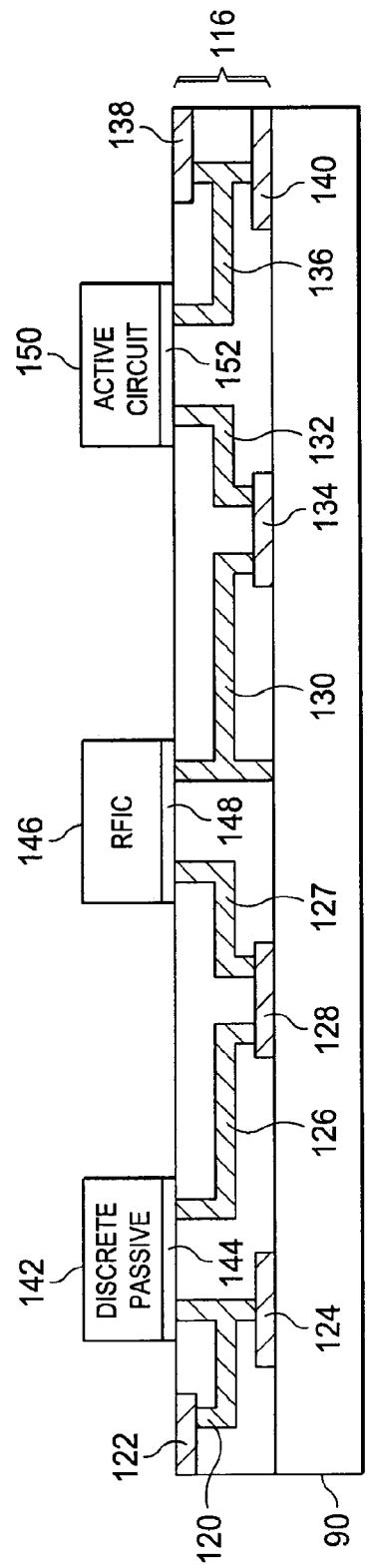
FIG. 3a
FIG. 3b

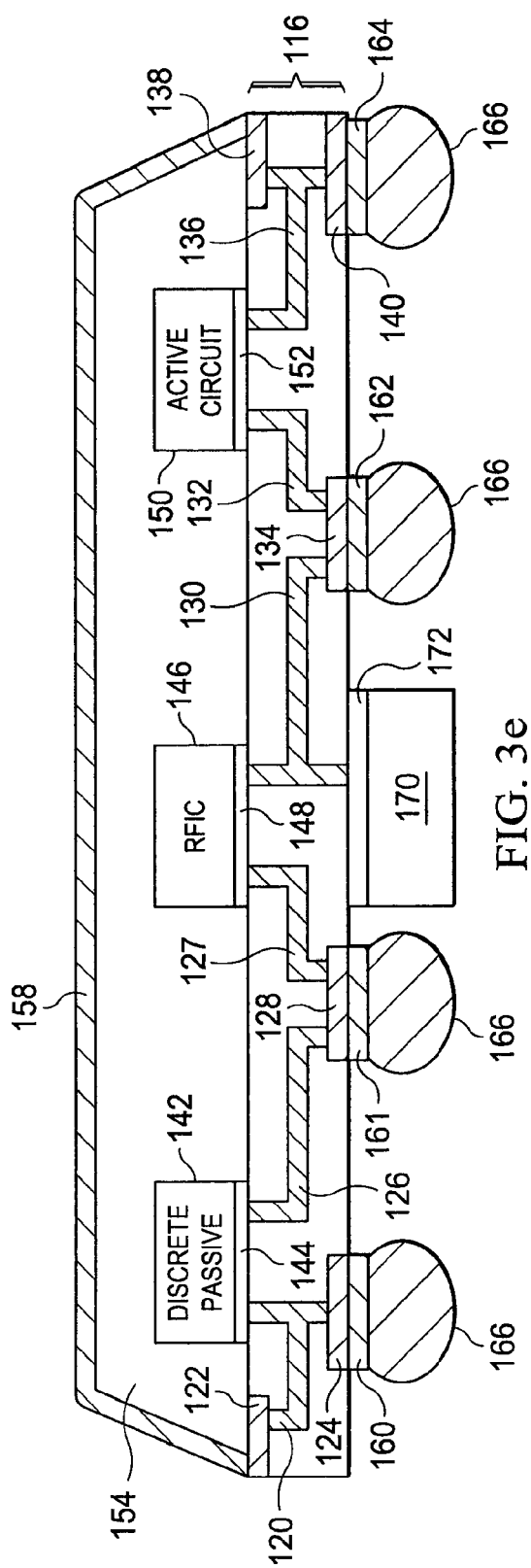
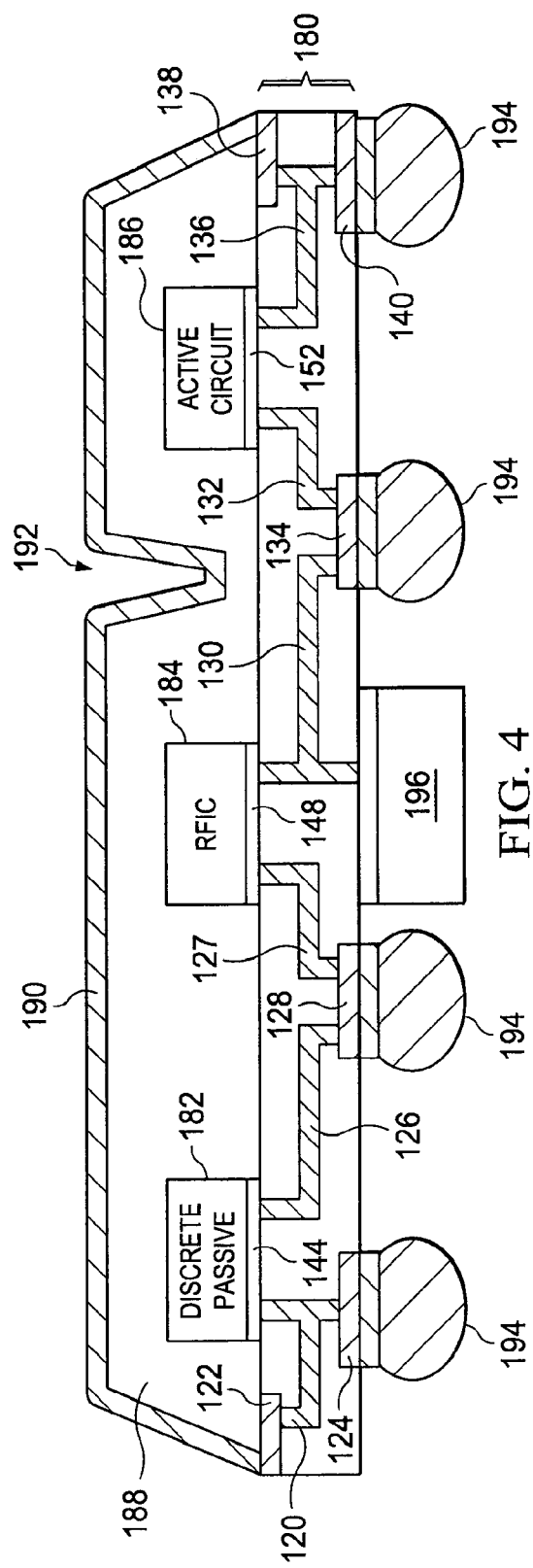

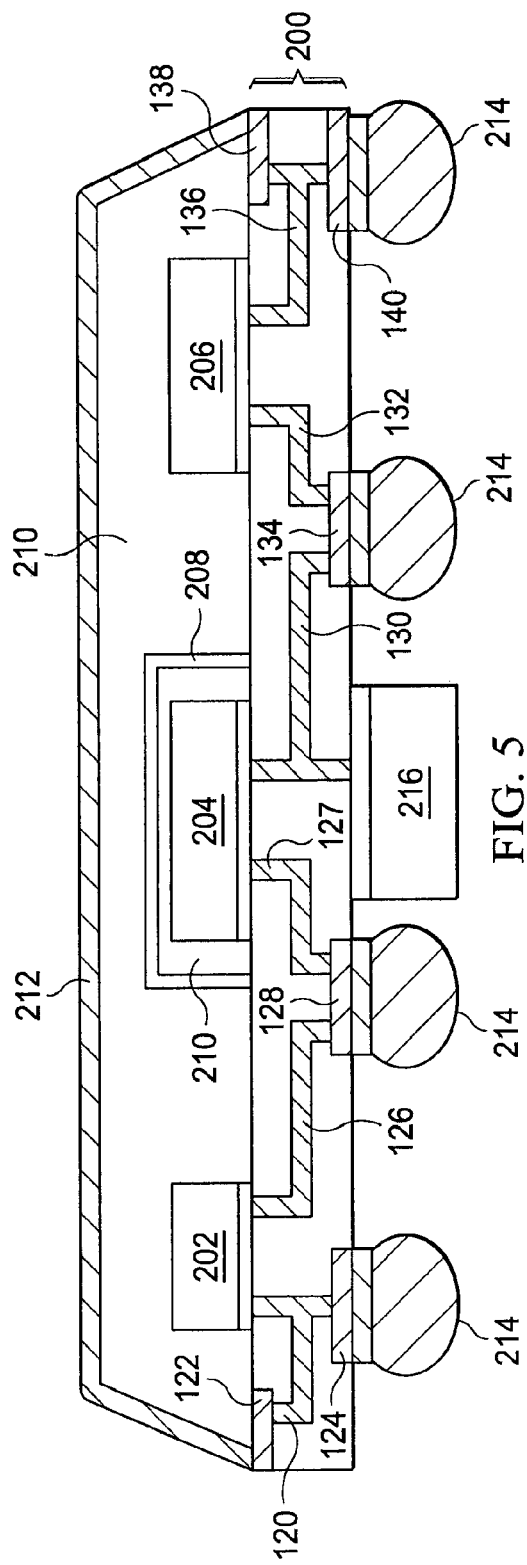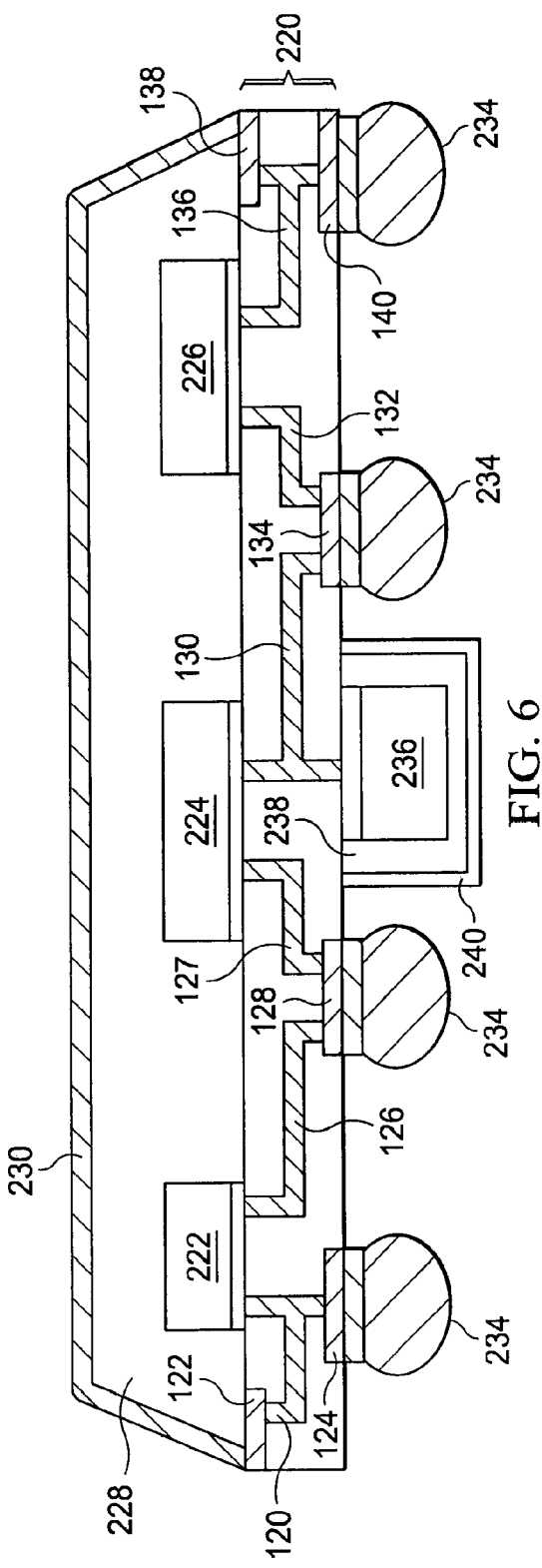

US 7,772,046 B2

SEMICONDUCTOR DEVICE HAVING ELECTRICAL DEVICES MOUNTED TO IPD STRUCTURE AND METHOD FOR SHIELDING ELECTROMAGNETIC INTERFERENCE

FIELD OF THE INVENTION

The present invention relates in general to semiconductor devices and, more particularly, to a semiconductor device having a shielding layer formed over electrical devices on an IPD structure for isolation from electromagnetic interference.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate undesired electromagnetic interference (EMI) and radio frequency interference (RFI), or other inter-device interference, such as capacitive, inductive, or conductive coupling, also known as cross-talk, which can interfere with the operation of adjacent circuit elements.

SUMMARY OF THE INVENTION

A need exists to shield semiconductor devices from EMI, RFI, and other inter-device interference. Accordingly, in one embodiment, the present invention is a method of making a semiconductor device comprising the steps of providing a substrate, forming an integrated passive device (IPD) structure on the substrate, mounting first and second electrical devices to a first surface of the IPD structure, depositing an encapsulant over the first and second electrical devices and IPD structure, forming a shielding layer over the encapsulant, electrically connecting the shielding layer to a conductive channel in the IPD structure to isolate the first and second electrical devices from interference, removing the substrate, and forming an interconnect structure on a second surface of the IPD opposite the first surface of the IPD structure. The interconnect structure is electrically connected to the first and second electrical devices and IPD structure.

In another embodiment, the present invention is a method of making a semiconductor device comprising the steps of providing an IPD structure, mounting a first electrical device to a first surface of the IPD structure, depositing an encapsulant over the first electrical device and IPD structure, forming a shielding layer over the encapsulant, and electrically connecting the shielding layer to a conductive channel in the IPD structure to isolate the first electrical device from interference.

In another embodiment, the present invention is a method of making a semiconductor device comprising the steps of providing an IPD structure, mounting a first electrical device to a first surface of the IPD structure, depositing an encapsulant over the first electrical device and IPD structure, forming a shielding layer over the encapsulant, and forming an interconnect structure on a second surface of the IPD structure opposite the first surface of the IPD structure. The interconnect structure is electrically connected to the first electrical device and IPD structure.

In another embodiment, the present invention is a semiconductor device comprising an IPD structure and first electrical device mounted to a first surface of the IPD structure. An encapsulant is deposited over the first electrical device and IPD structure. A shielding layer is formed over the encapsulant. The shielding layer is electrically connected to a conductive channel in the IPD structure to isolate the first electrical device from interference.

BRIEF DESCRIPTION OF THE DRAWINGS

FIGS. 2a-2d illustrate further detail of the semiconductor packages mounted to the PCB;

FIGS. 3a-3e illustrate a process of shielding electrical devices mounted to an IPD structure;

FIG. 4 illustrates a shielded recess formed between adjacent electrical devices mounted to IPD structure;

FIG. 5 illustrates a shielding cage formed over one of the electrical devices mounted to a front side of the IPD structure; and FIG. 6 illustrates a shielding cage formed over an electrical device mounted to a backside of the IPD structure.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
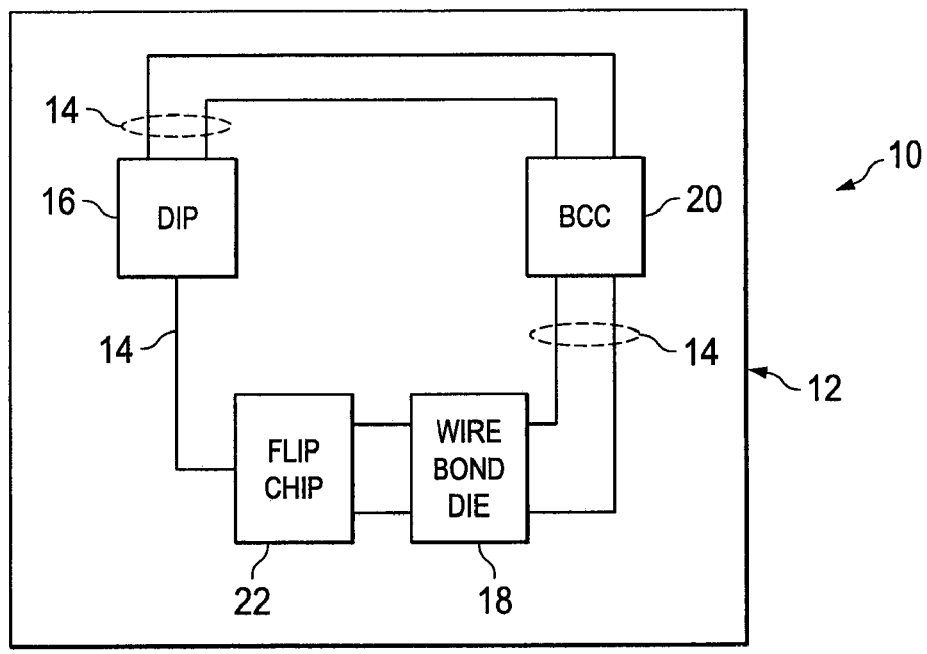
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip-chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate premade components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
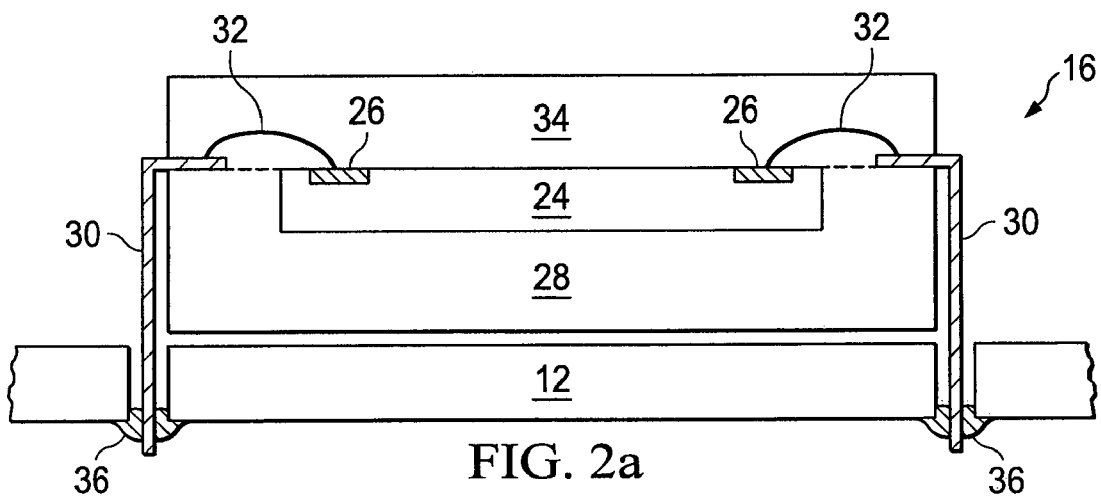

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die. For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. Encapsulant 34 is deposited over the package for environmental protection by preventing moisture and particles from entering the package and contaminating die 24, contact pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
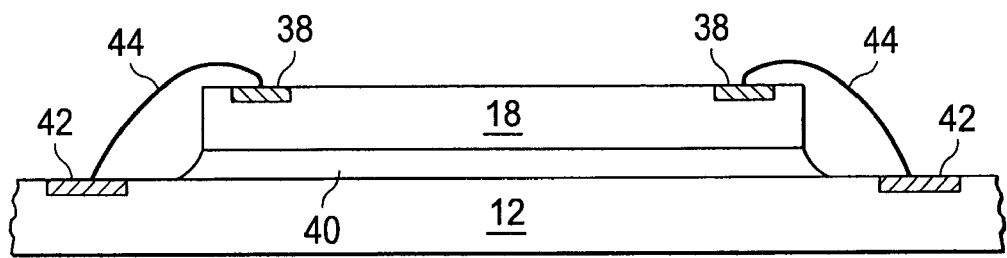

Referring to FIG. 2b, a wire bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72 is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Turning to FIG. 3a, a plurality of semiconductor die is formed on semiconductor wafer 88 using conventional integrated circuit processes, as described above. Semiconductor wafer 88 is mounted to a sacrificial substrate or carrier 90. Sacrificial carrier 90 can be made with silicon, ceramic, glass, molding compound, or other suitable low-cost, rigid material. An insulating layer 92 is formed on substrate 90. The insulating layer 92 provides stress relief for passivation layer 94 and, together with passivation layer 94, operates as an etch stop. The insulating layer 92 is typically made with silicon dioxide (SiO2), but can also be made with silicon nitride (Si3N4), silicon oxynitride (SiON), tantalum pentoxide (Ta2O5), zircon (ZrO2), aluminum oxide (Al2O3), or other material having dielectric insulation properties. The deposition of insulating layer 92 may involve PVD, CVD, printing, sintering, or thermal oxidation and result in a thickness ranging from 100-5000 Å.

A passivation layer 94 is formed over insulating layer 92 for structural support and physical and electrical isolation, and further acts as an etching stop layer during later etching and removal of sacrificial substrate 90. Passivation layer 94 can be made with one or more layers of Si3N4, SiN, SiO2, SiON, polyimide (PI), benzocyclobutene (BCB), polybenzoxazole (PBO), or other insulating material. Passivation layer 94 has a thickness of 500 Å to 30 μm. The layer stack 92-94 may be removed during removal of sacrificial substrate 90 by wet etching, dry etching, or CMP polishing.

An insulating layer 96 is formed on passivation layer 94 using a PVD, CVD, printing, or sintering process. The insulating layer 96 is made with Si3N4, SiO2, SiON, Ta2O5, ZrO2, Al2O3, or other material having dielectric insulation properties. The insulating layer 96 has a thickness ranging from 1000-5000 Å.

An electrically conductive layer 100 is deposited and patterned over insulation layer 96 using PVD, CVD, electrolytic plating, or electroless plating process. Conductive layer 100 has individual portions or sections 100a-100e. The individual portions of conductive layers 100a-100e can be electrically common or electrically isolated depending on the connectivity of the individual semiconductor die formed on semiconductor wafer 88. Conductive layer 100 can be made with Al, aluminum alloy, Cu, Sn, Ni, Au, Ag, or other electrically conductive material. Conductive layer 100 can have optional adhesion and barrier layers formed underneath or over the conductive layer. The adhesion and barrier layers can be titanium (Ti), titanium tungsten (TiW), titanium nitride (TiN), tantalum (Ta), or tantalum nitride (TaN).

A resistive layer 102 is patterned and deposited on conductive layer 100 and insulating layer 96 using PVD or CVD. Resistive layer 102 has individual portions or sections 102a-102c. Resistive layer 102a is disposed over conductive layer 10a. Resistive layer 102b is disposed over insulating layer 96 between conductive layers 100b-100c. Resistive layer 102c surrounds conductive layer 100e. Resistive layer 102 is made with tantalum silicide (TaxSiy) or other metal silicides, TaN, nichrome (NiCr), TiN, or doped poly-silicon having a resistivity of about 5 to 100 ohm/sq.

An insulating layer 104 is formed over and around resistive layer 102 using a patterning and deposition process. The insulating layer 104 has individual portions or sections 104a-104c. The insulating layer 104a is disposed over resistive layer 102a. The insulating layer 104b is disposed over resistive layer 102b. The insulating layer 104c is disposed over resistive layer 102c. The insulating layer 104 is made with Si3N4, SiO2, SiON, Ta2O5, ZnO, ZrO2, Al2O3, or other material having dielectric insulation properties. The deposition of insulating layer 104 may involve PVD or CVD. Resistive layer 102 and insulating layer 104 are formed with the same mask and etched at the same time. Alternatively, resistive layer 102 and insulating layer 104 can be patterned and etched with a different mask. Resistive layer 102c and insulating layer 104c are used in part to support subsequent solder bumps and wire bonding.

A passivation layer 106 provides structural support and physical and electrical isolation. Passivation layer 106 can be made with one or more layers of Si3N4, SiN, SiO2, SiON, PI, BCB, PBO, epoxy-based polymers, or other insulating material. Portions of passivation layer 106 are removed by etching to expose insulating layer 104a and conductive layers 100a-100d.

An electrically conductive layer 110 is patterned and deposited over insulating layer 104a, conductive layers 100a-100d through the openings in passivation layer 106. Conductive layer 110 is also patterned and deposited on insulating layer 96 and passivation layer 106. Conductive layer 110 can be made with Ti, TiN, Ta, TaN, TiW, Cr, Al, Cu, or other electrically conductive material. Conductive layer 110 may have an optional barrier layer. An electrically conductive layer 112 is patterned and deposited over conductive layer 110. Conductive layer 110 is an adhesive layer for conductive layer 112. Conductive layer 112 has individual portions or sections 112a-112d. The individual portions of conductive layers 112a-112d can be electrically common or electrically isolated depending on the connectivity of the individual semiconductor die formed on semiconductor wafer 88. Conductive layer 112 can be made with one or more layers of Cu, Al, Au, or other electrically conductive material. In one embodiment, conductive layer 112 contains a seed layer and electroplated layer. The deposition of conductive layers 110 and 112 uses a PVD, CVD, electrolytic plating, electroless plating, or lift-off process.

A passivation layer 114 provides structural support and physical and electrical isolation. Passivation layer 114 can be made with one or more layers of Si3N4, SiN, SiO2, SiON, PI, BCB, PBO, epoxy-based polymers, or other insulating material.

The structures described in FIG. 3a, e.g., the combination of conductive layer 100a-100d, resistive layers 102a-102c, insulating layer 104a-104b, conductive layer 110, and conductive layers 112a-112d, constitute one or more passive circuit elements or IPDs. For example, conductive layer 10a, resistive layer 102a, insulating layer 104a, and conductive layers 110 and 112b is a metal-insulator-metal (MIM) capacitor. Resistive layer 102b is a resistor element between conductor layers 100b and 100c in the passive circuit. The conductive layer 112d is an inductor. The conductive layer 112d is typically wound or coiled in plan-view, as shown by regions 112d in the cross-sectional view of FIG. 3a, to produce or exhibit the desired inductive properties. Conductive layer 100 is used as the bottom electrode of the MIM capacitor, electrode of the resistor, bridge of the inductor, and wire bonding pad. Other active and passive circuit elements can be formed on semiconductor wafer 88 as part of the electrically functional semiconductor device.

Structure 116 represents the IPD region of semiconductor wafer 88. In one embodiment, IPD structure 116 is about 10-20 micrometers (μm) in thickness. IPD structure 116 provides the electrical characteristics needed for high frequency applications, such as high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

A typical RF system requires multiple IPDs and other high frequency circuits in one or more semiconductor packages to perform the necessary electrical functions. However, high frequency electrical devices generate undesired electromagnetic interference (EMI), radio frequency interference (RFI), or other inter-device interference, such as capacitive, inductive, or conductive coupling, also known as cross-talk, which can interfere with the operation of adjacent or nearby circuit elements.

FIG. 3b illustrates an interconnect structure within IPD structure 116. The details of the IPD structure shown in FIG. 3a are omitted to simplify the drawing. Conductive channel 120 is disposed between insulating layers in IPD structure 116 and electrically connected to contact pad 122 and contact pad 124. In one embodiment, contact pad 124 is a peripheral stiffener ring, slot, or strap connected to an external ground potential. Conductive channels 126 and 127 are disposed between insulating layers in IPD structure 116 and electrically connected to contact pad 128. Likewise, conductive channels 130 and 132 are disposed between insulating layers in IPD structure 116 and electrically connected to contact pad 134. Conductive channel 136 is disposed between insulating layers in IPD structure 116 and electrically connected to contact pads 138 and 140. The conductive channels and contact pads can be formed at the same time in continuous steps on substrate 90.

A plurality of electrical devices is mounted to a top side of IPD structure 116, opposite substrate 90. For example, a discrete passive circuit element 142, e.g., inductor or capacitor, is mounted to IPD structure 116 with an adhesive material 144. A RFIC 146, e.g., semiconductor die containing RF circuits, is mounted to IPD structure 116 with adhesive material 148. An active circuit element 150, e.g., semiconductor die containing transistors and diodes, is mounted to IPD structure 116 with adhesive material 152. Other examples of electrical devices include baseband signal processing and memory devices. The adhesive material can be thermal epoxy, polymer composite, or inorganic bonding compounds. The electrical devices 142, 146, and 150 are electrically connected to conductive channels 126, 127, 130, and 132 to propagate electrical signals between the electrical devices, as well as the IPDs formed in structure 116. The electrical devices 142, 146, and 150 can be electrically connected to IPD structure 116 using contact pads, wire bonds, or solder bumps in a flip chip structure with an underfill material.

Figure 3C:
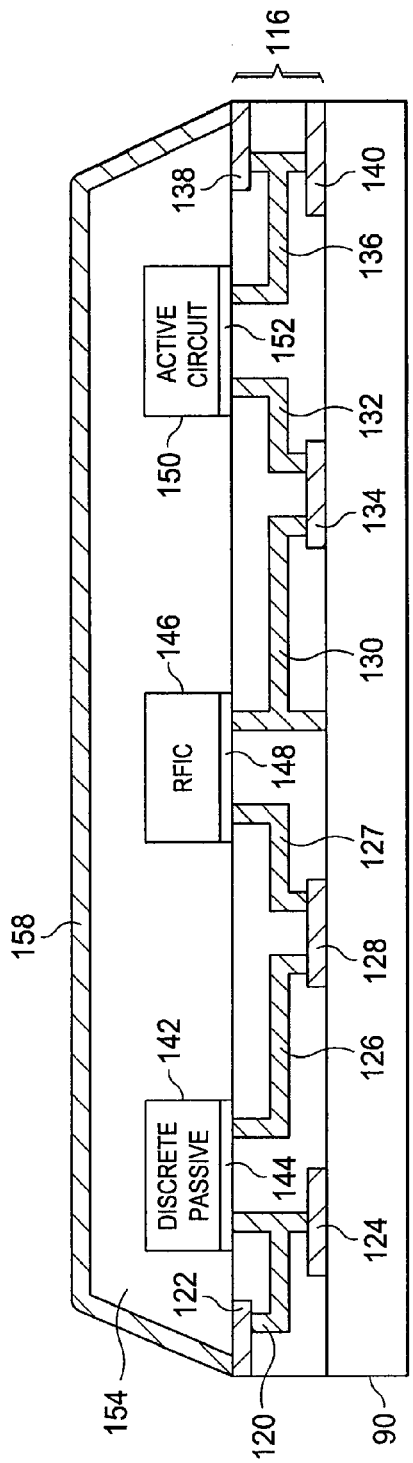

In FIG. 3c, an encapsulant or molding compound 154 is deposited over IPD structure 116 and electrical devices 142, 146, and 150 using a printing, compressive molding, transfer molding, liquid encapsulant molding, or other suitable applicator. The encapsulant 154 can be made with epoxy resin, epoxy acrylate, polymer, or polymer composite material. Encapsulant 154 is non-conductive and environmentally protects the semiconductor device from external elements and contaminants. Generally, encapsulant 154 has its coefficient of thermal expansion (CTE) adjusted to match that of components 116, 142, 146, and 150, and any other material contacted by the encapsulant. The CTE of encapsulant 154 can be adjusted using a filler such as a powder, fiber, or cloth additive. A suitable encapsulant material is generally characterized by low shrinkage, high resistivity, low dielectric constant, and low loss tangent. Note that encapsulant 154 is devoid or recessed around the periphery of IPD structure 116 to expose contact pads 122 and 138.

An electrically conductive shielding layer 158 with an optional seed layer is conformally deposited over encapsulant 154 and electrically connected to contact pads 122 and 138. Shielding layer 158 can be Cu, Al, stainless steel, nickel silver, low-carbon steel, silicon-iron steel, foil, epoxy, conductive resin, and other metals and composites capable of blocking EMI, RFI, and other inter-device interference. The seed layer can be made with Cu, Ni, nickel vanadium (NiV), Au, or Al. The seed layer and shielding layer 158 are conformally deposited using an electrolytic plating, electroless plating, sputtering, PVD, CVD, or other suitable metal deposition process. For non-metal materials, shielding layer 114 can be applied by spraying or painting. Shielding layer 158 completely covers all areas of encapsulant 154 above IPD structure 180, including relative to the top and sides of electrical devices 142, 146, and 150, to provide shielding for the enclosed semiconductor devices and IPD structure 116 against EMI, RFI, or other inter-device interference. The interference can come from external electrical devices such as IPDs or RF circuits, or from internal high frequency circuits. The electrical connection to grounded contact pad 122 aids in the EMI shielding feature provided by shielding layer 158.

Figure 3D:
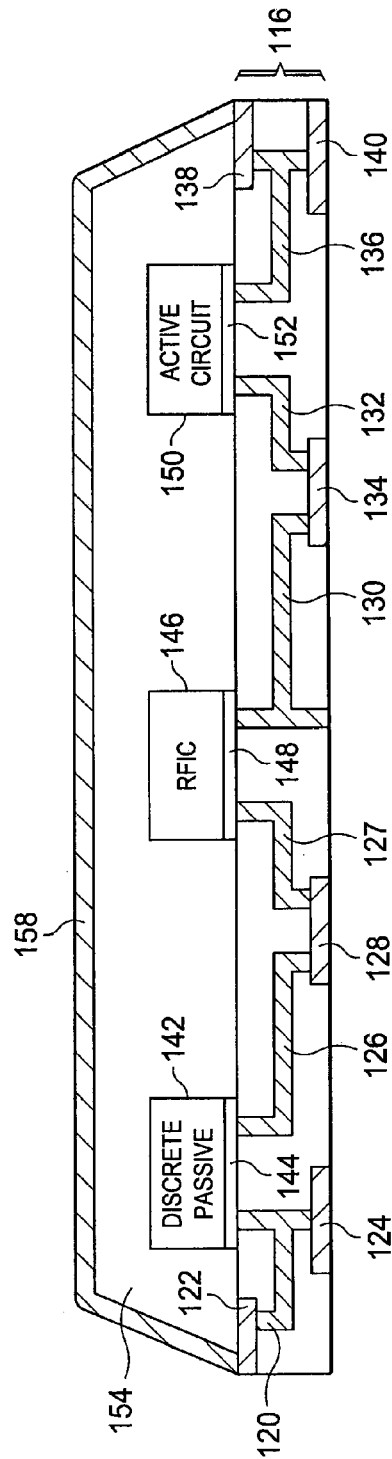

In FIG. 3d, sacrificial substrate 90 is removed by a combination of backgrinding, silicon wet etching, plasma etching, or chemical mechanical polishing (CMP). The backgrinding can be performed with a mechanical grinder followed by wet etching. The silicon wet etchant can be, for example, 0.5-10% HF and 0.5-10% hydrogen peroxide (H2O2).

In FIG. 3e, an interconnect structure is formed on the backside of semiconductor wafer 88. A metal layer stack can be deposited over contact pads 124, 128, 134, and 140 using an evaporation, electrolytic plating, electroless plating, screen printing, or etch-back process to form optional under bump metallization (UBM) layers 160, 161, 162, and 164. UBM layers 160-164 can be made with Al, Ti, Ni, NiV, Cu, or Cu alloy. An electrically conductive solder material is deposited over UBM 160-164 using an evaporation, electrolytic plating, electroless plating, ball drop, or screen printing process. The solder material can be any metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 166. In some applications, solder bumps 166 are reflowed a second time to improve electrical contact to UBM layers 160-164. Solder bumps 166 under contact pads 124 or 140 are connected to external ground potential for shielding layer 158. As an alternative interconnect structure, wire bonds can be connected to contact pads 124, 128, 134, and 140.

Additional electrical devices can be mounted to a backside of IPD structure 116, opposite electrical devices 142, 146, and 150. For example, an active circuit element 170, e.g., semiconductor die containing transistors and diodes, is mounted to the backside of IPD structure 116 with adhesive material 172. The electrical device 170 is electrically connected to conductive channel 130 to propagate electrical signals between the electrical devices, as well as the IPDs formed in structure 116. Electrical device 170 can be electrically connected to IPD structure 116 using contact pads, wire bonds, or solder bumps in a flip chip structure with underfill material. Electrical device 170 does not require EMI shielding.

Semiconductor wafer 88 is singulated into individual semiconductor devices. Each semiconductor device constitutes a system-in-package (SiP) with shielding against EMI, RFI, and other inter-device interference.

An alternate embodiment of the shielding for the IPD-based SiP semiconductor device is shown in FIG. 4. A semiconductor wafer is mounted to a sacrificial substrate or carrier. The semiconductor wafer contains an IPD structure 180, similar to structure 116 in FIG. 3a. Electrical devices 182, 184, and 186 are mounted to a top side of IPD structure 180. Electrical device 184 produces EMI or RFI that could adversely influence the operation of adjacent electrical device 186. Electrical devices 182-186 are electrically connected to conductive channels in IPD structure 180 to propagate electrical signals between the electrical devices, as well as the IPDs formed in structure 180, as described in FIG. 3b. An encapsulant or molding compound 188 is deposited over IPD structure 180 and electrical devices 182-186. In this case, a portion of encapsulant 188 is removed by an etching or drilling process to form recess 192 between adjacent electrical devices 184 and 186. Recess 192 may extend only partially into encapsulant 188, or all the way down to IPD structure 180. An electrically conductive shielding layer 190 with an optional seed layer is conformally deposited over encapsulant 188, including into recess 192. Shielding layer 190 can be Cu, Al, stainless steel, nickel silver, low-carbon steel, silicon-iron steel, foil, epoxy, conductive resin, and other metals and composites capable of blocking EMI, RFI, and other inter-device interference. Shielding layer 190 electrically connects to contact pads in IPD structure 180, similar to FIG. 3c. Shielding layer 190 completely covers all areas of encapsulant 188 above IPD structure 180, including relative to the top and sides of electrical devices 182-186 and inside recess 192, to provide shielding for the enclosed semiconductor devices and IPD structure 180 against EMI, RFI, or other inter-device interference. In particular, shielding layer 190 in recess 192 provides EMI and RFI isolation between electrical devices 184 and 186. The sacrificial substrate is removed. An interconnect structure shown as solder bumps 194 is added to the backside of the semiconductor wafer. An additional electrical device 196 is mounted to a backside of IPD structure 180, similar to FIG. 3e. The electrical device 196 is electrically connected to conductive channels in IPD structure 180 to propagate electrical signals between the electrical devices, as well as the IPDs formed in structure 180.

Another embodiment of the shielding for the IPD-based SiP semiconductor device is shown in FIG. 5. A semiconductor wafer is mounted to a sacrificial substrate or carrier. The semiconductor wafer contains an IPD structure 200, similar to structure 116 in FIG. 3a. Electrical devices 202, 204, and 206 are mounted to a top side of IPD structure 200. Electrical device 204 produces EMI or RFI that could adversely influence the operation of electrical devices 202 and 206. The electrical devices 202-206 are electrically connected to conductive channels in IPD structure 200 to propagate electrical signals between the electrical devices, as well as the IPDs formed in structure 200, as described in FIG. 3b. In this case, a shielding cage 208 is formed over electrical device 204. Shielding cage 208 can be Cu, Al, stainless steel, nickel silver, low-carbon steel, silicon-iron steel, and other metals and composites capable of blocking EMI, RFI, and other inter-device interference. Shielding cage 208 blocks EMI and RFI generated by electrical device 204 from adversely influencing the operation of electrical devices 202 and 206. An encapsulant or molding compound 210 is deposited over IPD structure 200, electrical devices 202 and 206, and shielding cage 208. Shielding cage 208 provides access for encapsulant 210 to flow into the cavity between the shielding cage and electrical device 204. An electrically conductive shielding layer 212 with an optional seed layer is conformally deposited over encapsulant 210. Shielding layer 212 can be Cu, Al, stainless steel, nickel silver, low-carbon steel, silicon-iron steel, foil, epoxy, conductive resin, and other metals and composites capable of blocking EMI, RFI, and other inter-device interference. Shielding layer 212 electrically connects to contact pads in IPD structure 200, similar to FIG. 3c. Shielding layer 212 completely covers all areas of encapsulant 210 above IPD structure 200, including relative to the top and sides of electrical devices 202-206, to provide shielding for the enclosed semiconductor devices and IPD structure 200 against EMI, RFI, or other inter-device interference. The sacrificial substrate is removed. An interconnect structure shown as solder bumps 214 is added to the backside of the semiconductor wafer. An additional electrical device 216 is mounted to a backside of IPD structure 200, similar to FIG. 3e. The electrical device 216 is electrically connected to conductive channels in IPD structure 200 to propagate electrical signals between the electrical devices, as well as the IPDs formed in structure 200.

Another embodiment of the shielding for the IPD-based SiP semiconductor device is shown in FIG. 6. A semiconductor wafer is mounted to a sacrificial substrate or carrier. The semiconductor wafer contains an IPD structure 220, similar to structure 116 in FIG. 3a. Electrical devices 222, 224, and 226 are mounted to a top side of IPD structure 220. The electrical devices 222-226 are electrically connected to conductive channels in IPD structure 220 to propagate electrical signals between the electrical devices, as well as the IPDs formed in structure 220, as described in FIG. 3b. An encapsulant or molding compound 228 is deposited over IPD structure 220 and electrical devices 222-226. An electrically conductive shielding layer 230 with an optional seed layer is conformally deposited over encapsulant 228. Shielding layer 230 can be Cu, Al, stainless steel, nickel silver, low-carbon steel, silicon-iron steel, foil, epoxy, conductive resin, and other metals and composites capable of blocking EMI, RFI, and other inter-device interference. Shielding layer 230 electrically connects to contact pads in IPD structure 220, similar to FIG. 3c. Shielding layer 230 completely covers all areas of encapsulant 208 above IPD structure 220, including relative to the top and sides of electrical devices 222-226, to provide shielding for the enclosed semiconductor devices and IPD structure 220 against EMI, RFI, or other inter-device interference. The sacrificial substrate is removed. An interconnect structure shown as solder bumps 234 is added to the backside of the semiconductor wafer. An additional electrical device 236 is mounted to a backside of IPD structure 220, similar to FIG. 3e. The electrical device 236 is electrically connected to conductive channels in IPD structure 220 to propagate electrical signals between the electrical devices, as well as the IPDs formed in structure 220. Electrical device 236 produces EMI or RFI that could adversely influence the operation of electrical devices 222-226. In this case, an encapsulant or molding compound 238 is deposited over electrical device 236. A shielding cage 240 is formed over encapsulant 238. Shielding cage 240 blocks EMI and RFI generated by electrical device 236 from adversely influencing the operation of electrical devices 222-206.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a substrate;
    forming an integrated passive device (IPD) structure on the substrate;
    mounting first and second electrical devices to a first surface of the IPD structure;
    depositing an encapsulant over the first and second electrical devices and IPD structure;
    forming a shielding layer over the encapsulant;
    electrically connecting the shielding layer to a conductive channel in the IPD structure to isolate the first and second electrical devices from interference;
    removing the substrate; and
    forming an interconnect structure on a second surface of the IPD structure opposite the first surface of the IPD structure, the interconnect structure being electrically connected to the first and second electrical devices and IPD structure.

2. The method of claim 1, further including mounting a third electrical device to the second surface of the IPD structure.

3. The method of claim 2, further including electrically connecting the first, second, and third electrical devices to conductive channels in the IPD structure.

4. The method of claim 2, further including forming a shielding cage over the third electrical device.

5. The method of claim 1, further including electrically connecting the conductive channel to ground potential.

6. The method of claim 1, further including:
    removing a portion of the encapsulant material between the first and second electrical devices to form a recess prior to forming the shielding layer; and
    forming the shielding layer over the encapsulant and in the recess.

7. The method of claim 1, further including forming a shielding cage over the first electrical device prior to depositing the encapsulant.

8. A method of making a semiconductor device, comprising:
    providing an integrated passive device (IPD) structure;
    mounting a first electrical device to a first surface of the IPD structure;
    depositing an encapsulant over the first electrical device and IPD structure;
    forming a shielding layer over the encapsulant; and
    electrically connecting the shielding layer to a conductive channel in the IPD structure to isolate the first electrical device from interference.

9. The method of claim 8, further including forming an interconnect structure on a second surface of the IPD structure opposite the first surface of the IPD structure, the interconnect structure being electrically connected to the first electrical device and IPD structure.

10. The method of claim 9, further including mounting a second electrical device to the second surface of the IPD structure.

11. The method of claim 10, further including electrically connecting the first and second electrical devices to conductive channels in the IPD structure.

12. The method of claim 10, further including forming a shielding cage over the second electrical device.

13. The method of claim 8, further including electrically connecting the conductive channel to ground potential.

14. The method of claim 8, further including:
    mounting a second electrical device to the first surface of the IPD structure;
    removing a portion of the encapsulant material between the first and second electrical devices to form a recess prior to forming the shielding layer; and
    forming the shielding layer over the encapsulant and in the recess.

15. The method of claim 8, further including forming a shielding cage over the first electrical device prior to depositing the encapsulant.

16. A method of making a semiconductor device, comprising:
    providing an integrated passive device (IPD) structure;
    mounting a first electrical device to a first surface of the IPD structure;
    depositing an encapsulant over the first electrical device and IPD structure;
    forming a shielding layer over the encapsulant;
    forming an interconnect structure on a second surface of the IPD structure opposite the first surface of the IPD structure, the interconnect structure being electrically connected to the first electrical device and IPD structure; and
    electrically connecting the shielding layer to a conductive channel in the IPD structure to isolate the first electrical device from interference.

17. The method of claim 16, further including electrically connecting the conductive channel to ground potential.

18. The method of claim 16, further including:
    mounting a second electrical device to the first surface of the IPD structure;

removing a portion of the encapsulant material between the first and second electrical devices to form a recess prior to forming the shielding layer; and forming the shielding layer over the encapsulant and in the recess.

19. The method of claim 16, further including forming a shielding cage over the first electrical device prior to depositing the encapsulant.

* * * * *